United States Patent [19]
Rizzo et al.

[11] Patent Number: 5,989,637
[45] Date of Patent: Nov. 23, 1999

[54] METHOD FOR PREVENTING FACET COATING OVERSPRAY

[75] Inventors: John S. Rizzo, Oley, Pa.; Gustav Edward Derkits, Jr., New Providence, N.J.; Raymond Frank Gruszka, Reading; John E. Boyd, Blandon, both of Pa.

[73] Assignee: Lucent Technologies, Inc., Murray Hill, N.J.

[21] Appl. No.: 09/061,410

[22] Filed: Apr. 16, 1998

[51] Int. Cl.$^6$ .................................................. B05D 1/32
[52] U.S. Cl. .................. 427/282; 427/250; 427/255.7; 427/405
[58] Field of Search .................................. 427/282, 250, 427/255.7, 405; 118/503, 728

[56] References Cited

U.S. PATENT DOCUMENTS 5,559,817  9/1996  Derkits, Jr. et al. ...................... 372/36
5,911,830  6/1999  Chakrabarti et al. .................... 118/503

*Primary Examiner*—Roy V. King

[57] ABSTRACT

A method and apparatus for preventing overspray onto bonding pads of a laser bar during facet coating includes manufacturing inserts with gaskets that are aligned with the laser bar such that the gaskets mask off the bonding pads during the facet coating process so that no overspray onto the bonding pads occurs. The gaskets are preferably made of gold with a thin titanium coating to prevent thermal compression bonding with the bonding pads. The inserts with gaskets are preferably manufactured using standard wafer processing techniques. The gaskets are preferably formed using the compliant layer metalization process described in U.S. Pat. No. 5,559,817.

9 Claims, 2 Drawing Sheets

METHOD FOR PREVENTING FACET COATING OVERSPRAY

FIELD OF THE INVENTION

The invention pertains to the field of semiconductor laser manufacturing. More particularly, the invention pertains to ensuring that an applied coating on a laser bar only coats wanted portions of the laser bar.

BACKGROUND OF THE INVENTION

Part of the manufacturing process of semiconductor lasers includes separating wafers into bars. Each bar is a one-dimensional array of laser chips. The manufacturing process requires the application of thin films of glasslike materials to portions, called facets, of the laser bars. The thin films are known as facet coatings. Due to the nature of the facet coating process, the coating can cover any unmasked areas on the laser in addition to the facet. Coating other areas of the laser is undesirable since the top and bottom of the laser have gold contacts for mechanical attachment of the device through a solder bond and for electrical connection to a power source through a ribbon bond.

SUMMARY OF THE INVENTION

Briefly stated, a method and apparatus for preventing overspray onto bonding pads of a laser bar during facet coating includes manufacturing inserts with gaskets that are aligned with the laser bar such that the gaskets mask off the bonding pads during the facet coating process so that no overspray onto the bonding pads occurs. The gaskets are preferably made of gold with a thin titanium coating to prevent thermal compression bonding with the bonding pads. The inserts with gaskets are preferably manufactured using standard wafer processing techniques. The gaskets are formed with a compliant layer, preferably using a compliant layer metalization process disclosed in U.S. Pat. No. 5,559,817.

According to an embodiment of the invention, a method for preventing overspray onto a bonding pad on a laser bar, the laser bar having at least one facet and containing at least one bonding pad on a surface other than the facet, includes the steps of: (a) manufacturing at least one insert having first and second gaskets on one side thereof, (b) positioning the laser bar adjacent the insert so that the first and second gaskets are touching the laser bar such that the first and second gaskets mask off the bonding pad, and (c) coating the facet with a facet coating.

According to an embodiment of the invention, an apparatus for preventing overspray onto a bonding pad of a laser bar, the laser bar having at least one facet and containing at least one bonding pad on a surface other than the at least one facet, includes means for manufacturing an insert having first and second gaskets on one side thereof, means for positioning the laser bar adjacent the insert so that the first and second gaskets are touching the laser bar such that the first and second gaskets mask off the bonding pad, and means for coating the at least one facet with a facet coating.

According to an embodiment of the invention, an apparatus for preventing overspray onto a bonding pad of a laser bar, the laser bar having at least one facet and containing at least one bonding pad on a surface other than the at least one facet, includes an insert having first and second gaskets on one side thereof, means for positioning the laser bar adjacent the insert so that the first and second gaskets are touching the laser bar such that the first and second gaskets mask off the bonding pad, and means for coating at least one facet with a facet coating.

DESCRIPTION OF THE PREFERRED EMBODIMENT

Figure 1:
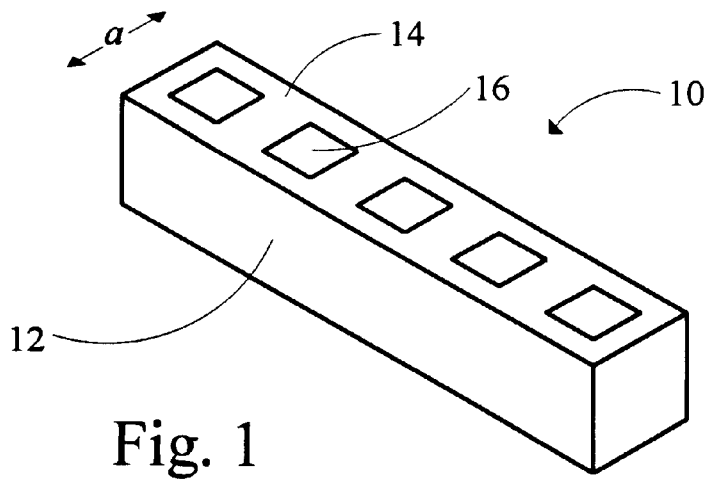
FIG. 1 shows a perspective view of a laser bar according to the prior art.

Referring to FIG. 1, a laser bar 10 is shown during the manufacturing process. Laser bar 10 includes a first facet 12 and a second facet (not shown) on the bar opposite first facet 12. A top surface 14 of laser bar 10 includes a plurality of bonding pads 16 which are used to connect the individual lasers of laser bar 10 to a power source (not shown) or to a housing structure (not shown). A bottom surface (not shown) is identical to top surface 14. A thin coating of a glasslike material is applied typically using PVD (physical vapor deposition) to the first and second facets to achieve product performance requirements.

Figure 2:
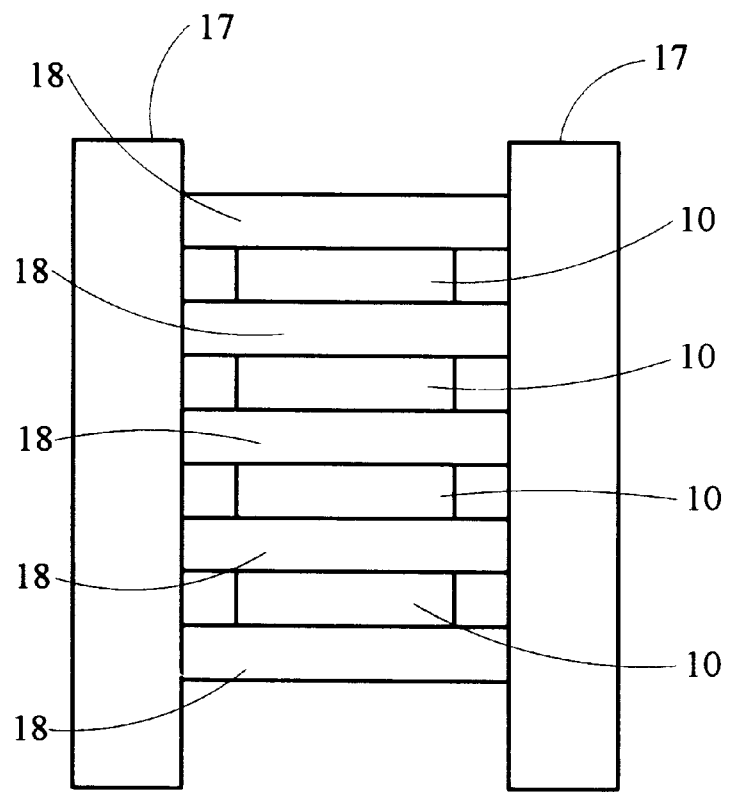
FIG. 2 shows a front elevation view of a plurality of laser bars with inserts clamped between two fixtures according to the prior art.

Referring also to FIG. 2, a plurality of laser bars 10 are spring clamped between two fixtures 17. The exact clamping pressure is not critical as long as (a) all parts in the stack are held firmly in place in intimate contact, and (b) the pressure is not so great that it damages the devices or buckles the stack. Each laser bar 10 is held between two inserts 18. If the bonding pads 16 are not in intimate contact with the inserts 18, unwanted facet coating coats parts of the bonding pads 16. This condition is known as overspray. Overspray on bonding pads 16 leads to weak bonds, with likely concomitant mechanical or thermal failures.

Figure 3:
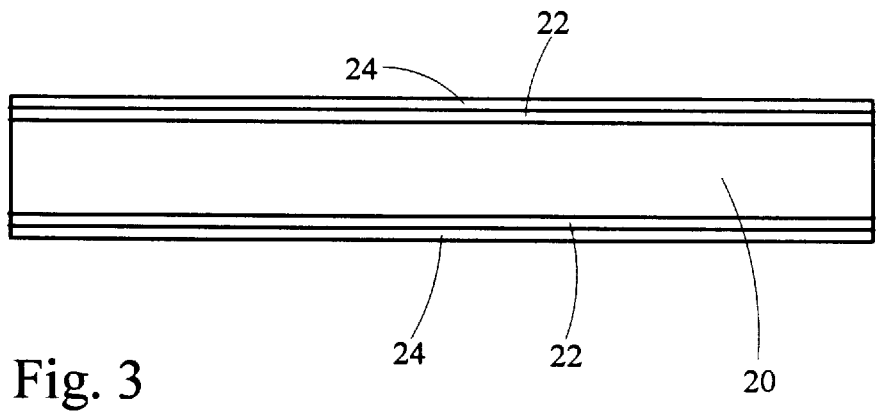
FIG. 3 shows a top view of an insert with gasket according to the present invention.
Figure 4:
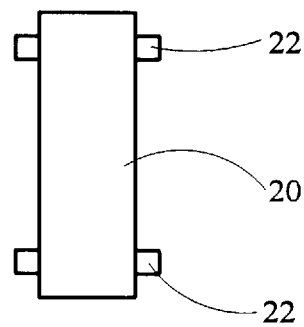
FIG. 4 shows a side view of an insert with gasket according to the present invention

Referring to FIGS. 3–4, an insert 20 includes two gaskets 22 on one side and two gaskets 22 on the other side. When a laser bar is sandwiched between two inserts 20 with gaskets 22, overspray is prevented. The insert 20 with gaskets 22 is preferably manufactured using standard wafer processing techniques. Wafer substrates of indium phosphide (laser) or silicon (integrated circuits) can be used. The thickness of the substrate is not critical to the manufacturing process.

Gaskets 22 are preferably strips of metal deposited on the substrate using standard photoresist and metal evaporation techniques. Gaskets 22 are preferably deposited on both sides of the wafer and aligned top side to bottom side using a typical mask alignment process. The metal strips which form gaskets 22 are preferably about six microns wide and four microns high.

Gaskets 22 run the full length of the wafer and are aligned to the cleave plane of the wafer. The centerline to centerline distance between gaskets 22 is determined by the cavity length of the laser bar to be facet coated, but preferably is about two mils less the nominal cavity length of the laser bar. The cavity length of laser bar 10 is shown as dimension a in FIG. 1. For example, if the gasket stripes are 10 mils on center for a 12 mil cavity length, a setback 24 of 0.5 mil is left between gasket 22 and the edge of insert 20. The spacing between gaskets is wide enough to cover the bonding pads 16 (FIG. 1) and narrow enough to allow for any variation in cavity length due to the separation process during manufacture.

Figure 5:
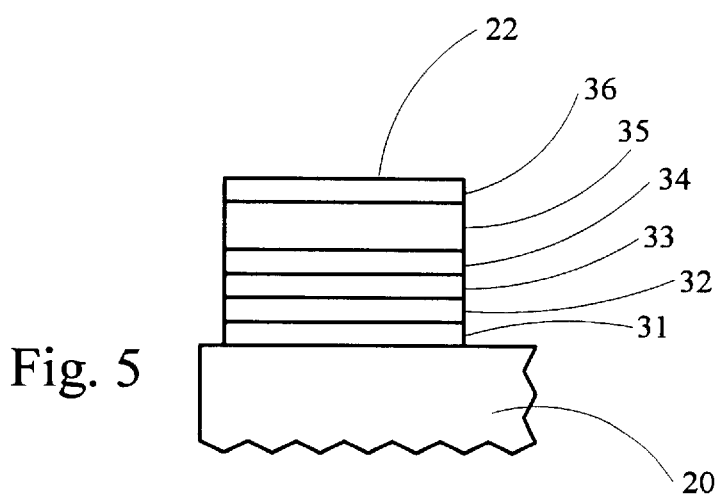
FIG. 5 shows a partial sectional view of an insert with gasket showing the layers that comprise the gasket.

Referring to FIG. 5, the metalization scheme for gaskets 22 is a compliant layer metalization process used for p-down bonding, such as disclosed in U.S. Pat. No. 5,559,817 (Derkits, Jr.), incorporated herein by reference. Gasket 22 is topped by an additional layer of titanium to prevent a gold-gold thermal compression bond between gasket 22 and the part being coated. The metalization is preferably applied to the substrate in the following order of layers: a titanium layer 31 (preferably about 500 Angstroms thick), a platinum layer 32 (preferably about 600 Angstroms thick), a gold layer 33 (preferably about 5,000 Angstroms thick), a platinum layer 34 (preferably about 2,000 Angstroms thick), a compliant layer 35 (preferably gold about 40,000 Angstroms thick), and a titanium layer 36 (preferably from 300 to 1,000 Angstroms thick).

The insert/gasket wafer is then separated into the individual inserts. A width of each insert 20 is determined by the cavity length of the laser bar being facet coated, preferably sized to be 1 mil less than the cavity length of the laser bars to be coated. This width allows the laser bar to extend one half of a mil beyond both the front edge and back edge of the insert, thereby preventing shadowing during the facet coating operation. Shadowing is caused when some part of the fixture 17 (FIG. 1) obscures the facet and prevents it from being properly coated.

Each insert 20 must be as long or longer than the laser bar to be coated. The length of each insert is preferably about 550 mils, which is a dimension of convenience determined by the fixture structure. The insert/gasket wafer is preferably separated into the inserts 20 using the same scribe and cleave process used to make the lasers: the insert/gasket wafer is mounted on tape and scribed into sections about 550 mils wide. Each section is then scribed into the individual inserts 20 with gaskets 22.

Gold is preferable in compliant layer 35 due to its malleability so that the gasket 22 conforms to any slight imperfections in the surface of laser bar 10. Any malleable metal, e.g., Au, Ag, Cu, can be used as long as it can be applied as a layer preferably using the CVD process and has a melting point above the glass-like substance used for the facet coating. Polymers would also work as long as (a) they can be deposited onto the insert 20, (b) they are clean, and (c) they could take temperatures up to 175° C. An insert 20 could be made as a one-piece polymer if the polymer meets the above characteristics and has thermal characteristics similar to the laser bars 16. Since gasket 22 conforms to the topology of laser bar 16, gasket 22 masks off the bonding pads 16 from the facet coating overspray and provides a slip-free hold on laser bar 16 during processing.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. A method for preventing overspray onto a bonding pad on a laser bar, said laser bar having at least one facet, said laser bar further containing at least one bonding pad on a surface other than said at least one facet, comprising the steps of:

manufacturing at least one insert having first and second gaskets on one side thereof;

positioning said laser bar adjacent said insert so that said first and second gaskets are touching said laser bar such that said first and second gaskets mask off said bonding pad; and coating said at least one facet with a facet coating.

2. The method of claim 1, wherein said at least one insert and said first and second gaskets are formed together as a one-piece polymer.

3. The method of claim 1, wherein said first and second gaskets are of gold with a titanium coating.

4. The method of claim 1, wherein said first and second gaskets are about 6 microns wide and about four microns high.

5. The method of claim 1, wherein said step of manufacturing comprises the steps of:

providing a substrate;

depositing at least a compliant layer on said substrate and disposed so that said at least a compliant layer forms at least two metal stripes; and separating, after the step of depositing, said substrate into said at least one insert wherein said metal stripes are said gaskets.

6. The method of claim 5, wherein said at least a compliant layer is a material selected from the group consisting of gold, silver, and copper.

7. The method of claim 5, wherein said step of depositing includes depositing a first titanium layer adjacent said substrate, followed sequentially by a first platinum layer, a first gold layer, a second platinum layer, said compliant layer, and a second titanium layer.

8. The method of claim 7, wherein said compliant layer is a material selected from the group consisting of gold, silver, and copper.

9. The method of claim 7, wherein said first titanium layer is about 500 Angstroms thick, said first platinum layer is about 600 Angstroms thick, said first gold layer is about 5,000 Angstroms thick, said second platinum layer is about 2,000 Angstroms thick, said compliant layer is gold about 40,000 Angstroms thick, and said second titanium layer is between 300 and 1,100 Angstroms thick.

* * * * *